US 6,738,142 B2

(12) United States Patent
van Kessel et al.

(10) Patent No.: US 6,738,142 B2
(45) Date of Patent: May 18, 2004

(54) INTEGRATED WAFER CASSETTE METROLOGY ASSEMBLY

(75) Inventors: Theodore Gerard van Kessel, Millbrook, NY (US); Hematha Kumar Wickramasinghe, Chappaqua, NY (US); Richard John Lebel, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 270 days.

(21) Appl. No.: 09/794,335

(22) Filed: Feb. 28, 2001

(65) Prior Publication Data

US 2002/0118365 A1 Aug. 29, 2002

(51) Int. Cl.[7] .............................................. G01N 21/55
(52) U.S. Cl. ....................................................... 356/445
(58) Field of Search ................................ 356/445–448, 356/239.7, 239.8, 239.3, 237.1–237.6, 600–640

(56) References Cited

U.S. PATENT DOCUMENTS 6,217,410 B1 * 4/2001 Holzapfel et al. ............. 451/6

FOREIGN PATENT DOCUMENTS

JP          2000277590       * 10/2000

* cited by examiner

Primary Examiner—Tu T. Nguyen
(74) Attorney, Agent, or Firm—Whitham, Curtis & Christofferson, P.C.; Stephen C. Kaufman

(57) ABSTRACT

An apparatus with one or more dimensions conforming to a wafer storage cassette used in semiconductor manufacturing which contains all or part of a sensor designed to measure a parameter of a wafer placed into the cassette. The intended use of the apparatus is in a process tool location normally occupied by a standard wafer cassette. By integrating all or part of the sensor into standard wafer storage cassette, a solution is provided whereby the same cassette and metrology system can be mechanically integrated into many process tools.

19 Claims, 2 Drawing Sheets

INTEGRATED WAFER CASSETTE METROLOGY ASSEMBLY

BACKGROUND OF THE INVENTION

1. Field of the Invention

Figure 1:
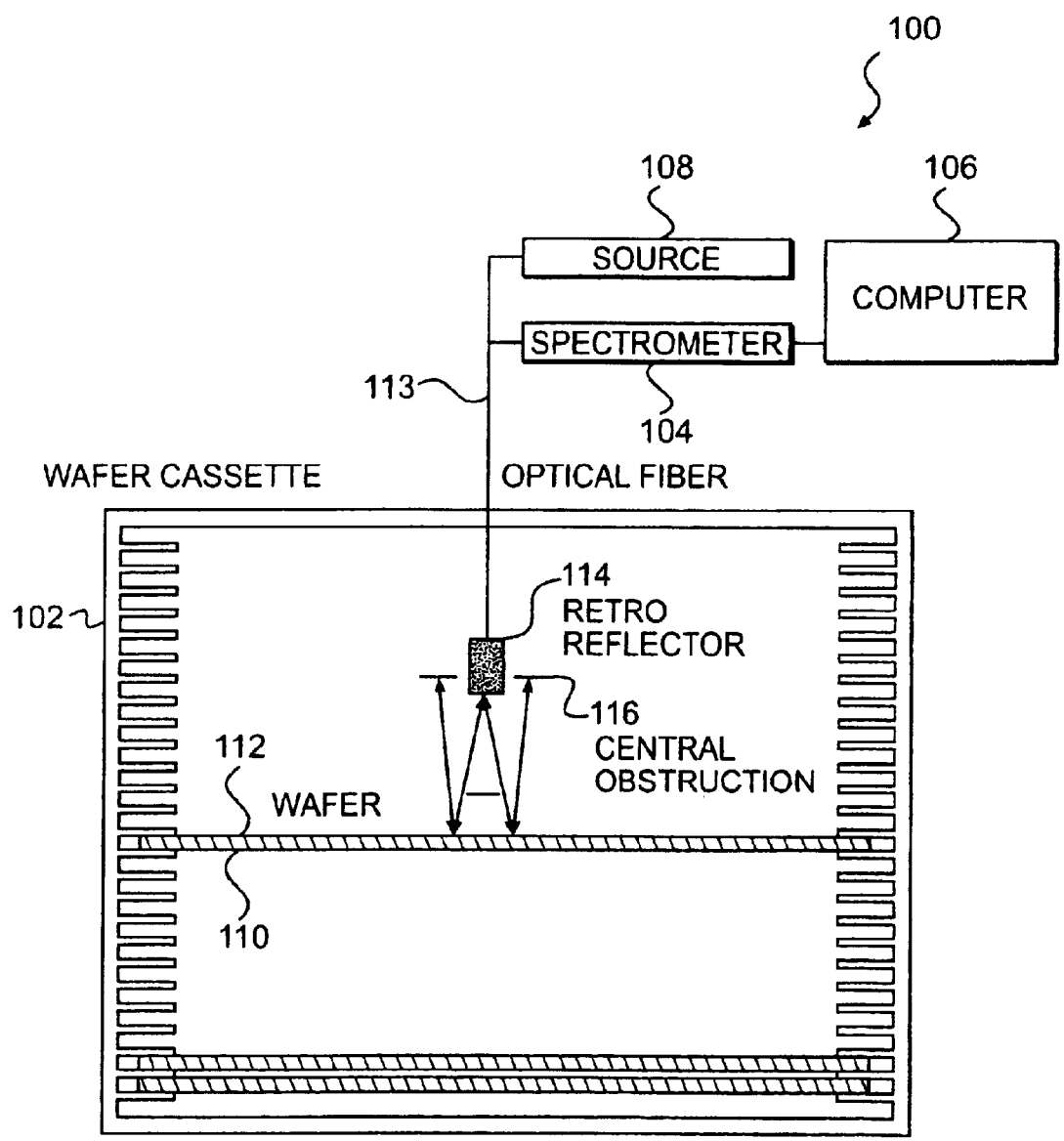

The present invention generally relates to semiconductor and micro fabrication equipment and, more particularly, to the integration of sensor technology within existing semiconductor and micro fabrication equipment for process control.

2. Background of the Invention

Semiconductor and micro fabrication equipment is designed to accept one or more cassettes of wafers. These wafers are the basic material which the majority of process equipment operate upon.

Wafers are automatically and individually loaded by a handling robot into the process tools from the storage cassette. The wafers are then processed. Following processing, the wafers are removed from the process tool by the handling robot and individually returned to the storage cassettes for removal and transport to the next phase of processing. Examples of next phase processing include photolithography tools, plating tools, chemical vapor deposition (CVD) tools, plasma etch tools including reactive ion etch (RIE) tools and chemical mechanical polish (CMP) tools. The processes listed above are typically controlled by a variety of measurement tools designed to accurately measure one or more of the process parameters and feed such parameters back to the process as a control input.

In the case of an oxide CMF process, silicon dioxide coated wafers are polished to a target thickness. To assure that the process is running under control, a wafer is periodically removed and its oxide thickness is measured externally with an optical thickness probe. The wafer is then returned to the process flow for further processing. Polish time is adjusted, if errors are found, to compensate and bring the process under control. This Send Ahead Measurement (SAHD) typically requires about five (5) minutes to perform, and is performed on a frequent basis.

A similar situation exists when using blanket copper plating for back end semiconductor wiring levels. In this process, a wafer is coated with a blanket layer of copper to a desired or "target" thickness. Again, the wafers are periodically removed to an external tool where the copper thickness is determined by performing an electrical sheet resistance measurement using a four point resistance probe. This SAHD process also takes significant time to perform.

The need to remove the product from the manufacturing process tool and perform ex-situ measurements occurs frequently and at a significant cost in terms of process time, handling and capital equipment. However, as metrology equipment decreases in size, it is increasingly desirable to integrate the equipment into the process tools to save process cycle time and redundant wafer positioning systems. This integration, while desirable, is often not possible due to the nature of the process tool, itself. This is because wafer access may be difficult to impossible within the process tool.

SUMMARY OF THE INVENTION

It is therefore an object of the present invention to provide an apparatus which integrates a variety of compact measurement equipment into semiconductor and micro fabrication process tools.

According to the present invention, there is provided an apparatus with one or more dimensions conforming to those of a standard wafer storage cassette containing all or part of a measurement sensor designed to measure a parameter of a wafer placed into the cassette. The intended use of the apparatus is in a process tool location normally occupied by a standard wafer cassette. By integrating all or part of the sensor into a standard wafer storage cassette a solution is provided whereby the same cassette and metrology system can be mechanically integrated into many process tools. This integration eliminates the need to modify the process tool to accommodate new sensor technology and allows the benefit of in process measurement of a parameter (such as film thickness) without removal mid-handling of the wafer to separate equipment.

BRIEF DISCUSSION OF THE DRAWINGS

Figure 2:
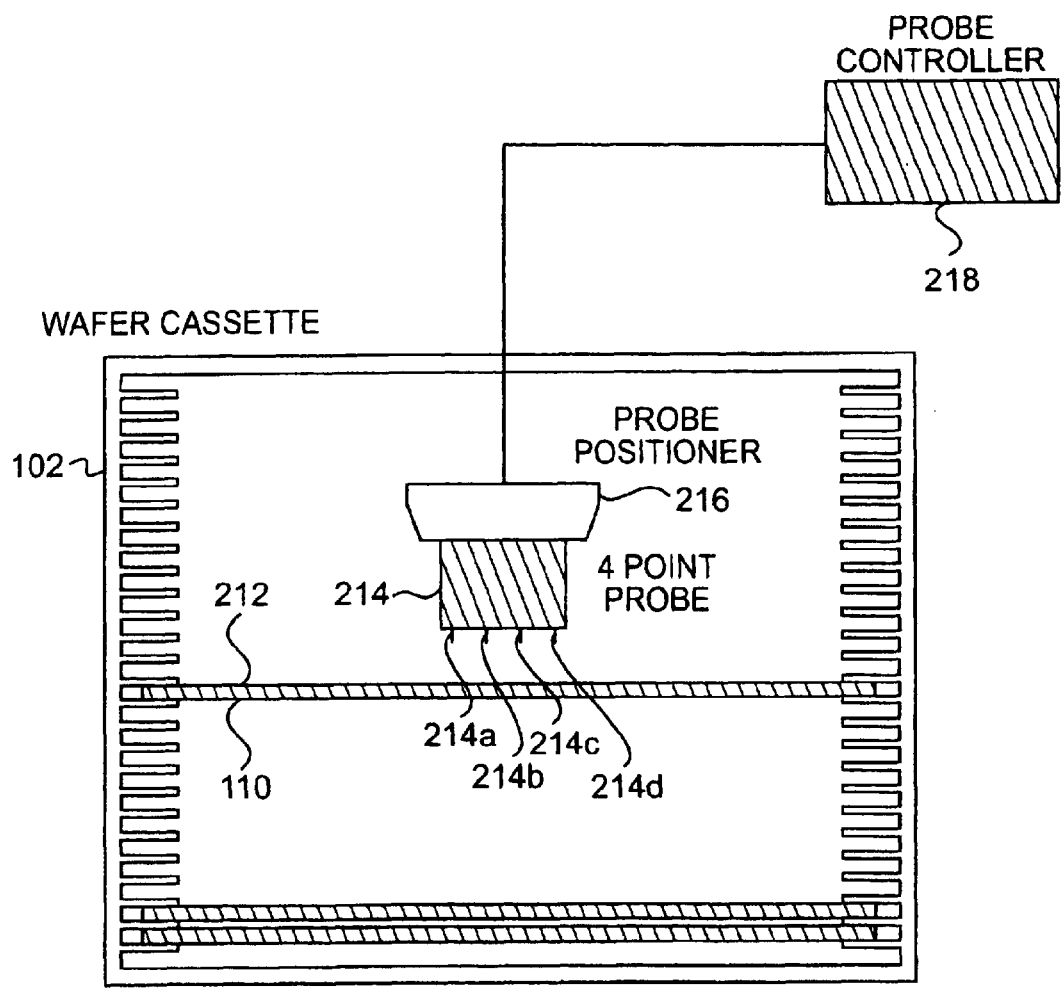

The foregoing and other objects, aspects and advantages will be better understood from the following detailed description of preferred embodiments of the invention with reference to the drawings in which:

FIG. 1 shows a first embodiment of a wafer cassette with an integrated optical film thickness measurement system; and FIG. 2 shows a second embodiment of a wafer cassette with an integrated film thickness measurement system.

DETAILED DESCRIPTION OF A PREFERRED EMBODIMENT

While there are a variety of measurements that can be accomplished with compact equipment, the use of film thickness measured during the wafer process is one example used by the present invention. By measuring film thickness during the wafer process, and more particularly while the wafer is positioned within a wafer cassette during the processing of the wafer, a savings of cycle time, handling costs, measurement tool costs and floor space is achieved, resulting in cost and process advantages. By way of one specific advantage, the present invention is capable of preventing drift of the process tool during the processing of the wafer by providing a rapid feed back of information for controlling the wafer process.

Referring now to FIG. 1, a first embodiment of the integrated wafer cassette may be provided for use in CMP processing of an oxide film. Specifically, FIG. 1 shows an optical probe assembly 100 positioned at least partially within a wafer cassette 102. The optical probe assembly includes a spectrometer 104, a computer 106 and a light source 108, as well as a fiber bundle 114 and retro reflectors 116 (e.g., mirrors). A fiber optic 113 communicates between the spectrometer 104 and the fiber bundle 114. In the preferred embodiment, the fiber bundle 114 and the retro reflectors 116 are positioned within the wafer cassette 102, and the fiber optic 113 is positioned partly within the wafer cassette 102. The spectrometer 104, computer 106 and light source 108 may be positioned external to the wafer cassette 102; however, these components may also be positioned partly or entirely within the wafer cassette 102 (depending on the specific application used with the present invention). A wafer 110 having a thin film 112 such as, for example, an oxide film, is positioned within the wafer cassette 102 for processing and measurement.

In operation, it is now possible to measure the thickness of the film 112 the wafer 110 during processing of the wafer within the wafer cassette 102. This is accomplished by measuring and analyzing a digital spectrum of the reflected light transmitted from the film 112 during the processing of the wafer, itself. Specifically, the wafer 110 is first placed within the wafer cassette 102 under the optical probe assembly 100. It is noted that the wafer 110 becomes visible to the system of the present invention once it is placed below the measurement probe. This allows for automatic detection and measurement of the film 112. Also, the optic fiber 114, source 108, spectrometer 104 and computer 106 allow for a portion of the system to be located outside the wafer cassette 102.

Still referring to FIG. 1, light of visible or infrared wavelength is then generated in the source 108 and transmitted through the multi fiber bundle 114 to a probe end of the fiber 114. The light is then emitted from the fiber bundle 114 and reflected off the film 112 of the wafer 110 to the retro reflectors 116. The light is then reflected back to the wafer 110 and into the fiber bundle 114. The received light is then transmitted to the spectrometer 104 which measures a digital spectrum of the reflected light and transmits the digital spectrum to the computer 106. The computer 106 then analyzes the digital spectrum to determine the thickness of the film, in any known conventional manner.

By way of example, in simple films the spectrum takes the form of a sine wave. The computer 106 then analyzes the spectrum to compute the period of the sine wave. From this value, the computer 106 computes the thickness of the film 112 on the wafer 110. For more complicated films, additional processing is performed using standard methods. Once the thickness parameter is measured, it is immediately available for use in feeding back to the process tool to adjust the performance thereby eliminating the need to remove the wafer 110 and measure the parameter in an external tool. This saves cycle time, measurement tool cost, wafer handling damage and floor space resulting in significant cost advantages.

It should be understood by those of skill in the relevant art that the placement of the probe is not critical in the embodiment of FIG. 1. Typically, a center and edge measurement is sufficient to control most deposition and removal processes for blanket films; however, it should also be understood that multiple probes may also be employed by the present invention in various locations.

FIG. 2 shows a second embodiment of the present invention. By using the system shown in FIG. 2, it is possible to measure the thickness and/or sheet resistivity of a metal film 212 on wafer 110 placed in the cassette 102 under a four point electrical resistance probe assembly 214. The four point electrical resistance probe assembly 214 of FIG. 2 is preferably located within the wafer cassette 102 and is manipulated via a positioner 216. The four point electrical resistance probe assembly 214 includes four probe contacts, 214a, 214b, 214c and 214d. A probe controller 218 controls both the positioning of the probe assembly 214 and the voltage applied and measured via the four probe contacts, 214a, 214b, 214c and 214d. In the embodiment of FIG. 2, the probe controller 218 may be positioned remote from the wafer cassette 102.

In operation, the measurement of sheet resistance of the wafer 110 is performed by lowering the probe assembly 214, via the positioner 216, until the probe contacts 214a, 214b, 214c and 214d contact the film 212 on the wafer 110. Once in contact, a voltage is applied across the outer two pins 214a and 214d, and a measurement of the voltage/current properties of the film is made using the inner two pins 214b and 214c. It should be well understood by those of skill in the art that other arrangements of pin contacts can be used for the application of the voltage and measurement thereof by the present invention. The movement of the probe assembly as well as the applied voltage and the measurements thereof are controlled by the probe controller 218.

The embodiment of FIG. 2 is especially useful in blanket metal deposition processes for back end copper films. In this type of operation, copper is plated in a cluster tool to a desired depth and removed and placed in the wafer cassette. Once in the wafer cassette, the plated wafer would normally be removed for measurement; however, by using the present invention the wafer is measured immediately while remaining in the wafer cassette 102. The measured thickness is then used to adjust the plating process for the next batch of wafers. This process, again, saves cycle time, handling costs, measurement tool costs and floor space resulting in a cost and process advantage. Additional advantages (of both embodiments) include the ability to rapidly feed back information to the process tool for more accurate control of the process. This immediate feedback prevents tool drift which may be of a critical advantage.

It should be understood by those skilled in the art that the embodiments of FIGS. 1 and 2 eliminate the requirement of moving the wafer to a different location to perform the measurement of the film. This eliminates the need to remove the wafer from the wafer cassette which, in turn, eliminates the need for complex handling equipment. This is particularly true in a cluster tool environment which integrates lithography, resist apply and bake tools into one tool with flexible wafer handling. The integrated wafer cassette of the present invention thus extends the use of the cluster tool dramatically because the time saved allows multiple process tools to simultaneously benefit therefrom, thus magnifying the cost savings advantage.

While the invention has been described in terms of preferred embodiments, those skilled in the art will recognize that the invention can be practiced with modification within the spirit and scope of the appended claims.

What is claimed is:

1. A measurement system for use in measuring a parameter of a semiconductor wafer during the manufacturing process thereof, comprising:
   a mechanical cassette; and
   a sensor at least partially located within the mechanical cassette and capable of measuring a parameter of the wafer located within the mechanical cassette, wherein the mechanical cassette is capable of being inserted in one or more process tools designed to act on the wafer placed within the mechanical cassette.

2. The measurement system as recited in claim 1, wherein the parameter is film thickness.

3. The measurement system as recited in claim 1, wherein the sensor comprises:
   a probe positioned within the mechanical cassette;
   a probe controller for controlling a position of the probe; and
   means for transmitting signals between the probe and the probe controller.

4. The measurement system as recited in claim 3, wherein the probe is an optical probe.

5. The measurement system as recited in claim 3, wherein the probe controller is located external to the mechanical cassette.

6. The measurement system as recited in claim 3, wherein the means for transmitting is an optic fiber.

7. The measurement system as recited in claim 6, wherein a portion of the optic fiber is located outside of the mechanical cassette.

8. The measurement system as recited in claim 3, wherein the probe is a four point electrical resistance probe assembly.

9. The measurement system as recited in claim 8, wherein the four point electrical resistance probe assembly includes four probe contacts.

10. The measurement system as recited in claim 9, wherein:

two contacts of the four probe contacts apply voltage to the semiconductor wafer; and two remaining contacts of the four probe contacts measure the voltage applied by the two contacts.

11. The measurement system as recited in claim 10, wherein the two contacts are outermost contacts and the two remaining contacts are inner adjacent contacts.

12. The measurement system as recited in claim 8, further comprising a positioner for manipulating the four point electrical resistance probe.

13. The measurement system as recited in claim 8, wherein a probe controller controls voltage applied to two contacts of the four probe contacts.

14. The measurement system as recited in claim 8, wherein the four point electrical resistance probe assembly is located within the mechanical cassette.

15. The measurement system as recited in claim 14, wherein one or more process tools includes a cluster tool.

16. The measurement system as recited in claim 1, wherein the sensor comprises an optical probe assembly positioned at least partially within the mechanical cassette.

17. The measurement system as recited in claim 16, wherein the optical probe assembly comprises:

a spectrometer located external to the mechanical cassette;

a computer in communication with the spectrometer;

a light source in communication with the spectrometer;

a fiber optic associated with the light source and the spectrometer and extending to within mechanical cassette; and reflectors positioned within the mechanical cassette and receiving light from and reflecting light to the fiber optic.

18. The measurement system as recited in claim 17, wherein the light source generates light of visible or infrared wavelength.

19. The measurement system as recited in claim 17, wherein the light source generates light that is reflected to the spectrometer, the spectrometer measures a digital spectrum of the reflected light and transmits the digital spectrum to the computer.

* * * * *